United States Patent [19]

Sometani et al.

[11] Patent Number: 4,804,922
[45] Date of Patent: Feb. 14, 1989

[54] VOLTAGE SENSOR

[75] Inventors: Taro Sometani, Hamamatsu; Naotoshi Takaoka, Inuyama; Mitsuo Aida, Komaki; Mitsuharu Kudomi, Konan; Yasuhiro Tanahashi, Gifu; Katsunori Aoki, Inuyama, all of Japan

[73] Assignee: Energy Support Corporation, Inuyama, Japan

[21] Appl. No.: 923,560

[22] Filed: Oct. 27, 1986

[30] Foreign Application Priority Data

| Nov. 1, 1985 [JP] | Japan | 60-246763 |
| Nov. 9, 1985 [JP] | Japan | 60-251495 |
| Nov. 9, 1985 [JP] | Japan | 60-251496 |

[51] Int. Cl.$^4$ .................................... G01R 29/12
[52] U.S. Cl. ............................ 324/457; 324/72; 324/108; 324/109
[58] Field of Search ............... 324/457, 109, 72, 126, 324/108

[56] References Cited

U.S. PATENT DOCUMENTS

| 1,949,136 | 2/1934 | Adair | 455/341 |
| 2,137,579 | 11/1938 | Lundholm et al. | 324/126 |
| 2,468,125 | 4/1949 | Silver | 324/126 |
| 3,383,565 | 5/1968 | Gritton | 361/412 |
| 3,524,133 | 8/1970 | Arndt | 324/126 |
| 3,774,108 | 11/1973 | Ogilvie | 324/457 |
| 4,121,154 | 10/1978 | Keating | 324/126 |
| 4,197,493 | 4/1980 | Juve et al. | 324/457 |
| 4,318,042 | 3/1982 | Eda et al. | 324/457 |
| 4,427,945 | 1/1984 | Sperry, III | 324/446 |
| 4,504,781 | 3/1985 | Hargrove | 324/72.5 |
| 4,520,318 | 5/1985 | Hascal et al. | 324/457 |

FOREIGN PATENT DOCUMENTS

| 1132653 | 7/1962 | Fed. Rep. of Germany . |
| 1134157 | 8/1962 | Fed. Rep. of Germany . |
| 1605058 | 1/1973 | France . |
| 0147878 | 11/1979 | Japan .................... 324/457 |
| 61-22463 | 3/1980 | Japan . |
| 61-22465 | 3/1980 | Japan . |
| 61-22466 | 3/1980 | Japan . |

Primary Examiner—Ernest F. Karlsen
Attorney, Agent, or Firm—Jordan and Hamburg

[57] ABSTRACT

This invention relates to a voltage sensor for sensing a voltage on an electrically charged object such as a distribution line or the like, the sensor being disposed with an insulation space to the object. The voltage sensor includes an amplifier circuit for outputting a signal having a waveform similar to that of a displacement current inflowing from the electrically charged object via the insulation space, and a filter circuit for extracting a signal having predetermined frequencies from the output of the amplifier circuit and outputting an alternating current waveform similar to the potential of the electrically charged object.

11 Claims, 7 Drawing Sheets

VOLTAGE SENSOR

BACKGROUND OF THE INVENTION

1. Field of the Invention

This invention relates to a voltage sensor used for sensing a voltage on an electrically charged object such as a distribution line.

2. Description of the Related Art

In a conventional zero-phase-sequence voltage sensing apparatus, potential transformers (hereinafter referred to as the "PTs") or capacitance potential devices (hereinafter referred to as the "PDs") are used as voltage sensors installed associated with different phase distribution lines. In addition, voltage sensors, using optoelectronic techniques, other than PTs also have been recently proposed. The voltage sensors using optoelectronic techniques have been called optical potential transformers (hereinafter referred to as the "OPTs"). There are many such OPTs studied which utilize the fact that when a linear polarization enters an element having Pockels effect, put under an electric field, crossing at a right angle with the electric field, the refractive indexes for two orthogonal components of the polarization exhibit different changes and also propagation velocity varies depending upon the intensity of the filed and as a result the two optical orthogonal components differ in phase, so that the output light becomes elliptically polarized.

Conventional PTs or PDs such as those mentioned above are of the contact type in which they are fixed directly to electrically charged objects such as cables included in the distribution lines. Thus electrical isolation must be considered. In addition, there is the problem that since PTs or PDs use a coil, a core, capacitors, etc., the entire arrangement will be large and heavy and thus the time required for fixing them will increase.

Since OPTs are disposed in noncontact relationship to the distribution lines, they are good in terms of isolation. They, however, need a laser oscillator, etc., in order to obtain a linear polarization and thus the entire arrangement becomes expensive.

SUMMARY OF THE INVENTION

It is a principal object of this invention to provide a noncontact voltage sensor which has a simple structure of components few in number and which can thus be manufactured inexpensively.

It is another object of this invention to provide a voltage sensor which can improve the accuracy of measurement by shutting out electric fields from objects other than an electrically charged object, the voltage on which is to be measured.

It is still another object of this invention to provide a zero-phase-sequence voltage sensing apparatus used for distribution lines in which compact sensors can be fixed to or removed away for exchange from the corresponding distribution lines in a noncontact manner.

In order to attain these objects, according to this invention, a voltage sensor is disposed with an insulation space to an electrically charged object in order to sense a voltage on the object. The sensor includes an amplifier circuit which produces an output having a waveform similar to that of a displacement current inflowing from the electrically charged object through the insulation space, and a filter circuit which extracts a signal of predetermined frequencies from the output of the amplifier circuit and which outputs a signal of an alternating current waveform similar to the potential of the electrically charged object.

Other and further objects of this invention will become obvious upon an understanding of the illustrative embodiments about to be described or will be indicated in the appended claims, and various advantages not referred to herein will occur to one skilled in the art upon employment of the invention in practices.

DETAILED DESCRIPTION OF THE PREFERRED EMBODIMENTS

One embodiment of this invention will now be described with respect to FIGS. 1 to 8.

Figure 1:
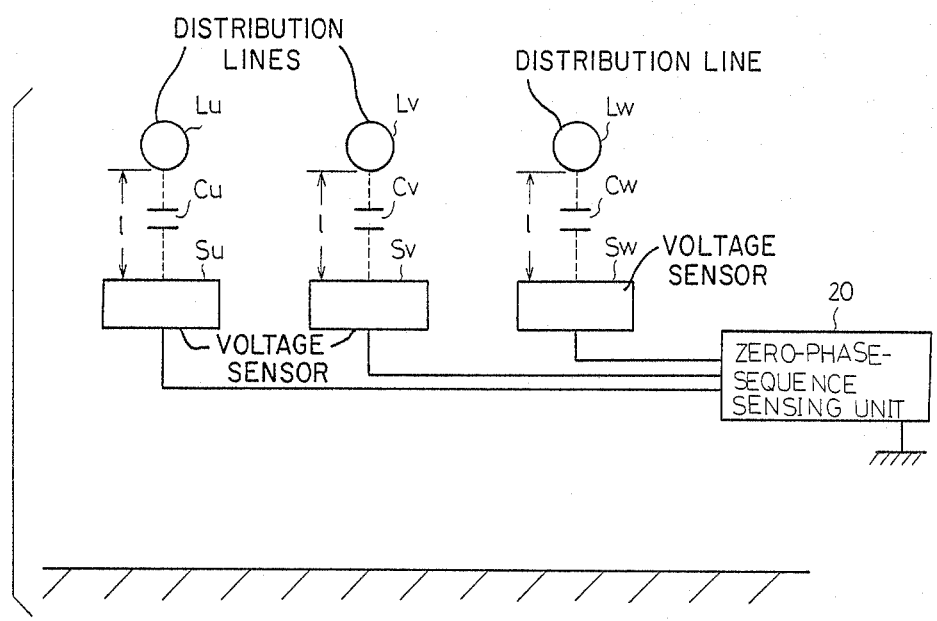
FIG. 1 illustrates the structure of a zero-phase-sequence voltage sensing apparatus for distribution lines, showing one embodiment of this invention.

As shown in FIG. 1, a plurality of voltage sensors Su, Sv and Sw having the same structure are disposed at approximately equal distances of insulation space from the corresponding phase distribution lines Lu, Lv and Lw. A case 1 forming part of a housing of each of the sensors Su, Sv and Sw is channel-like, and has, at each end, mounting margins 2 folded inwardly at right angles from both side ends and a bottom end of the case, as shown in FIG. 3. An inverted channel-like cover 3 is secured fixedly to the case 1 by screws 4 inserted through both end walls of the cover and the corresponding mounting margins 2 of the case so as to cover both open ends and an upper opening of the case 1 (see FIG. 2). A window 5 through which a displacement current flows into the housing (hereinafter referred to as the "displacement current inflow section") is provided in the top of the cover 3. The housing including case 1 and cover 3 is made of an electrically conductive material such as aluminium and functions as a shield electrode for a detection electrode 10 to be described in more detail later.

Figure 2:
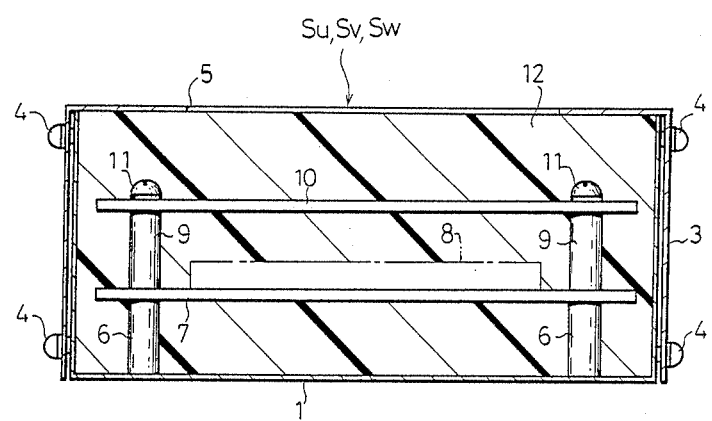
FIG. 2 is a cross-sectional view of a voltage sensor according to this invention.
Figure 3:
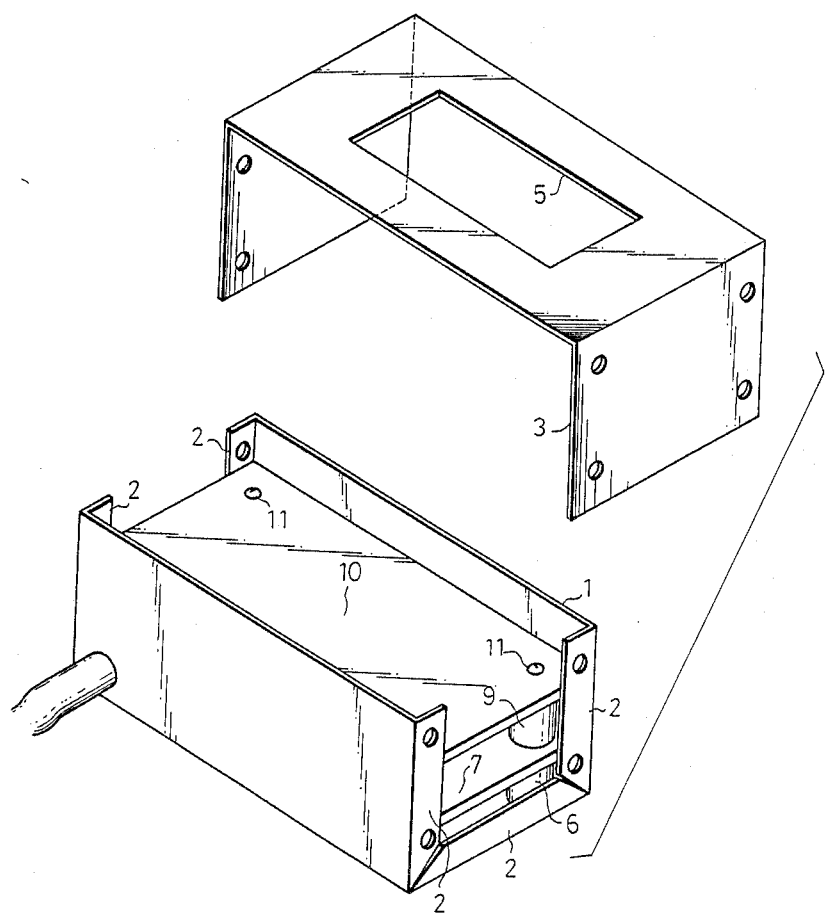
FIG. 3 is an exploded perspective view of the voltage sensor of FIG. 2 from which an filler is removed away.

As shown in FIG. 2, fixed to the bottom of the case 1 through supports 6 is a base plate 7 on which is provided a signal processing circuit 8 to be described in more detail later. The plate-like collection electrode, into which a displacement current flows, or detection electrode 10 is secured fixedly by means of screws 11 to upper ends of spacers 9 upstanding from the base plate 7. Thus the detection electrode 10 is disposed parallel to the upper surface of cover 3 and covered with and isolated from the case 1 and cover 3 except for that portion of electrode 10 opposite to the window 5.

The detection electrode 10 is made of an electrically conductive material of metal, conductive resin, conductive rubber or the like. In this embodiment, aluminium easy to work is used. After the base plate 7 and detection electrode 10 are assembled, the case 1 is filled up with a filler 12 of high permittivity.

Figure 4:
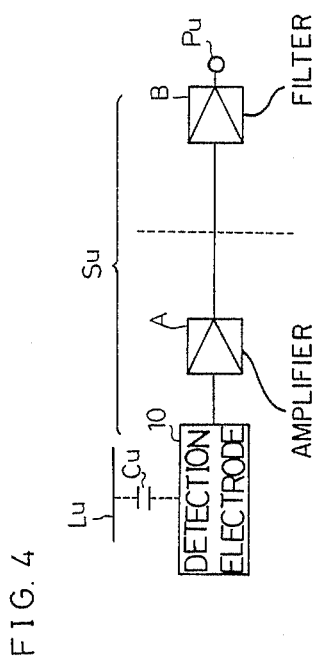
FIG. 4 is a block diagram roughly showing the circuit structure of the voltage sensor of FIG. 2.

The signal processing circuit 8 will be described with respect to FIGS. 4 and 5. It consists mainly of an amplifier circuit A and a band-pass filter circuit B.

When the amplifier circuit A receives a displacement current from the detection electrode 10, it amplifies the displacement current and outputs a signal having a waveform similar to that of the displacement current. The specific structure of the amplifier circuit is as follows. An input terminal P1 of the signal processing circuit 8 is connected via a variable resistor R1 to a grounding conductor E1. The case 1 and cover 3 constituting the shield electrode is connected via a terminal P2 to the grounding conductor E1. A parallel circuit including a pair of oppositely directed diodes D1 and D2 is connected between both ends of the variable resistor R1 and functions as a protective circuit to shut out an excessive input from the detection electrode 10.

The resistor R1 is connected to an inverting input terminal of an operational amplifier OP1 while an noninverting input terminal of the amplifier is connected via a resistor R3 to the grounding conductor E1. A parallel circuit including a capacitor C1 and a resistor R4 is connected between the inverting input terminal and output terminal of the amplifier OP1.

The resistors R1-R4, diodes D1, D2, capacitor C1 and operational amplifier OP1 constitute the amplifier circuit A, the output terminal of which is connected via a voltage follower including an operational amplifier OP2 to a band-pass filter B of the next stage. The follower serves to perform impedance conversion by providing a high input impedance and a low output impedance.

When the band-pass filter B receives a signal having a waveform similar to that of a displacement current from the operational amplifier OP2 constituting the voltage follower, it is arranged to selectively amplify and extract, on the basis of the input signal, a signal having an alternating current waveform, the center frequency of which is 60 Hz. The specific circuit of the filter B is as follows. A series circuit including a capacitor 2 and a resistor 5 is connected between the output terminal of the amplifier OP2 and an inverting input terminal of an operational amplifier OP3 which has a noninverting input terminal connected via a resistor R6 to the grounding conductor E1. A parallel circuit including a series circuit of capacitors C3, C4 and a series circuit of resistors R7, R8 is connected between the noninverting input terminal and output terminal of operational amplifier OP3. A resistor R9 is connected between the grounding conductor E1 and the junction point a of capacitors C3 and C4. A capacitor C5 is connected between the grounding conductor E1 and the junction point b of resistors R7 and R8.

The resistors R5–R9, capacitors C2–C5 and amplifier OP3 constitute the band-pass filter B, the output terminal of which is connected via a voltage follower including an operational amplifier OP4 to an output terminal Pu. The voltage follower performs impedance conversion by providing a high input impedance and a low output impedance. The output terminals of other voltage sensors Sv, Sw are shown by Pv, Pw, respectively, in FIG. 6.

The voltage sensors Su, Sv and Sw disposed at the corresponding phase distribution lines Lu, Lv and Lw are connected to a zero-phase-sequence sensing unit 20 which includes a sensing circuit 21 which in turn includes an adder circuit 22 and a power supply circuit 23 for the adder circuit and the voltage sensors.

The adder circuit 22 synthesizes signals output from the respective voltage sensors Su, Sv and Sw and selected so as to have predetermined frequencies and outputs a zero-phase-sequence voltage signal V0 to its output terminal P. The specific structure of adder circuit 22 is as follows.

The output terminals Pu, Pv and Pw of the voltage sensors Su, Sv and Sw are connected via the corresponding variable input resistors R11, R12 and R13 to an inverting input terminal G of an operational amplifier OP5 which has a noninverting input terminal grounded via a resistor 14, and an output terminal connected via a resistor R15 to the point G. In addition, the output terminal of the amplifier OP5 is connected via a voltage follower including an operational amplifier OP6 and a resistor R16 to the output terminal P. The voltage follower OP6 serves to perform impedance conversion by providing a high input impedance and a low output impedance.

The resistors R11 - R16 and amplifiers OP5 and OP6 constitute the adder circuit 22.

The power supply circuit 23 will now be described. Connected to an alternating-current power source 100 V is the primary winding of a current transformer 24 which has the secondary winding connected to a full-wave rectifier 25. A point d of the transformer secondary winding is connected to a grounding line E2. Smoothing capacitor C6 and capacitor C7 are connected between the plus terminal of the rectifier 25 and grounding conductor E2. A 3-terminal regulator 26 is connected between the plus terminal of the rectifier 25 and the grounding conductor E2 and has its output terminal connected to a +Vcc terminal. Capacitors C8 and C9 are connected between the output terminal of the regulator 26 and the grounding conductor E2.

Smoothing capacitor C10 and capacitor C11 are connected between the minus terminal of the full-wave rectifier 25 and the grounding conductor E2. A 3-terminal regulator 27 is connected between the minus terminal of full-wave rectifier 25 and the grounding conductor E2 with the output terminal of the regulator 27 being connected to a −Vcc terminal. Capacitors 12 and 13 are connected between the output terminal of the regulator 27 and the grounding conductor E2.

The operation of the zero-phase-sequence voltage sensing apparatus constituted as above will now be described.

In FIG. 1, the voltage sensors Su, Sv and Sw are disposed at approximately equal distances l from the corresponding phase distribution lines Lu, Lv and Lw. When the steady-state load currents on the basis of normal three-phase-sequence voltages flow through the distribution lines, displacement currents flowing through electrostatic capacities Cu, Cv and Cw formed between the respective distribution lines Lu, Lv and Lw and ground as a reference potential collect on the corresponding detection electrodes 10 through the corresponding windows 5 in the voltage sensors as the displacement current inflow section (FIG. 2).

Figure 5:
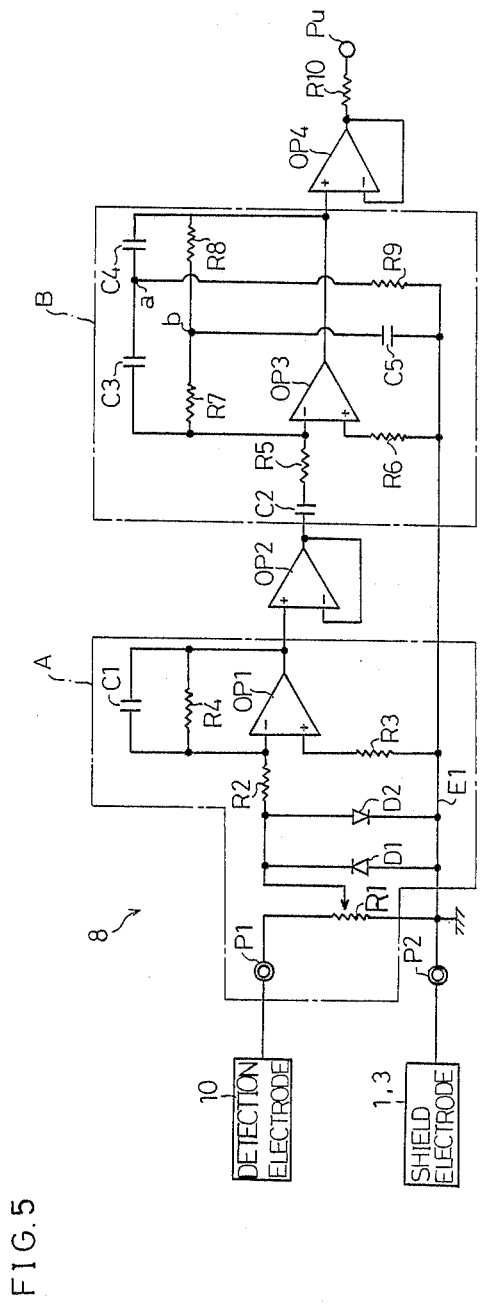
FIG. 5 is an electrical circuit diagram of a voltage sensor showing the details of the amplifier circuit and filter circuit.

These displacement currents are applied to the corresponding amplifier circuits A of the signal processing circuits 8 in the voltage sensors Su, Sv and Sw (FIG. 5). The amplifier circuits A integrate and amplify the corresponding displacement currents and output signals having waveforms similar to those of the displacement currents to the corresponding operational amplifiers OP2. When the signals having the waveforms similar to those of the displacement currents are input to the corresponding band-pass filters B via the corresponding operational amplifiers OP2 constituting the voltage followers, the band-pass filters B selectively amplify and extract signals each having an alternating current waveform, the center frequency of which is 60 Hz, on the basis of the corresponding input signals.

Figure 7:
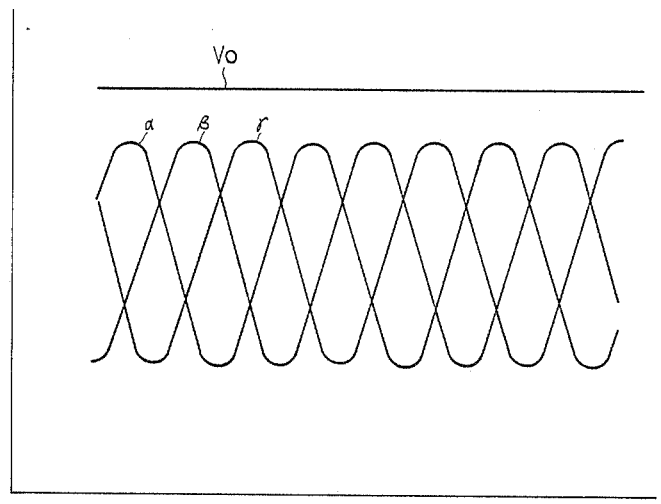
FIG. 7 shows an oscillograph which displays waveforms of the zero-phase-sequence voltage output from the sensor circuit of FIG. 6 and of three phase voltages on the distribution lines.
Figure 6:
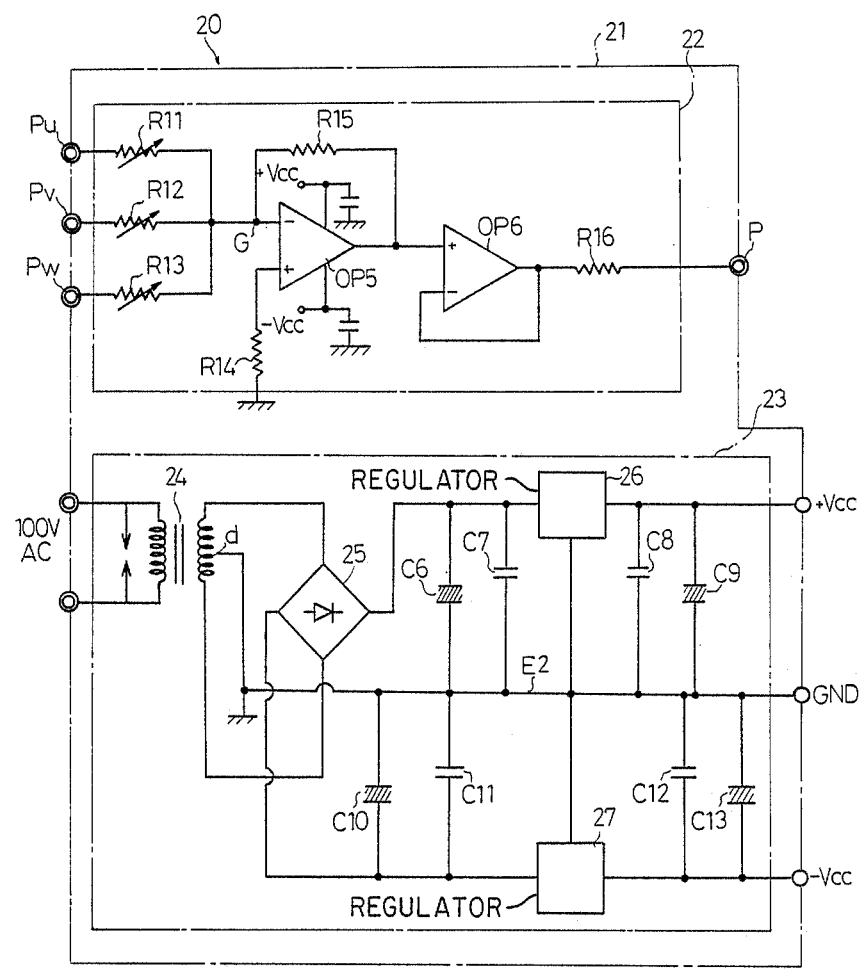
FIG. 6 is an electrical circuit diagram detailedly showing a sensor circuit including an adder circuit and a power source circuit, provided in the zero-phase-sequence sensing apparatus shown in FIG. 1.

Thereafter, in FIG. 6, the adder circuit 22 of the zero-phase-sequence sensing unit 20 synthesizes the signals output by the respective voltage sensors Su, Sv and Sw and selected so as to have predetermined frequencies and outputs a zero-phase-sequence voltage signal V0, as shown in FIG. 7, to the output terminal P. In FIG. 7, α, β, γ denote the waveforms of voltages applied to the distribution lines Lu, Lv and Lw, respectively.

As described above, since the respective phase-sequence-component voltages with respect to ground are normally in equilibrium, the value of the zero-phase-sequence voltage Vo obtained by synthesis at the adder circuit 22 is zero.

On the other hand, if ground fault occurs at any one of the distribution lines Lu, Lv and Lw, the equilibrium among the respective phase-sequence voltages relative to ground level will be broken. The signals output via the respective signal processing circuits 8 of the voltage sensors Su, Sv and Sw to the zero-phase-sequence sensing unit 20 are synthesized by the adder circuit 22 and as a result a zero-phase-sequence voltage of a constant value is sensed. Thus the occurrence of ground fault in any one of the distribution lines is detected.

The housing, including case 1 and cover 3, of each of the voltage sensors Su, Sv and Sw functions as a shield electrode which efficiently prevents the inflow of displacement currents from objects other than the distribution line, the voltage on which is to be measured, so that the measurement is hardly influenced adversely by other distribution lines.

The following measurement was performed in order to compare the output characteristics of the voltage sensors in the zero-phase-sequence voltage sensing apparatus according to this invention with the output characteristics of PDs and voltage sensors X each utilizing a Pockels effect element having a conventional structure.

Figure 8:
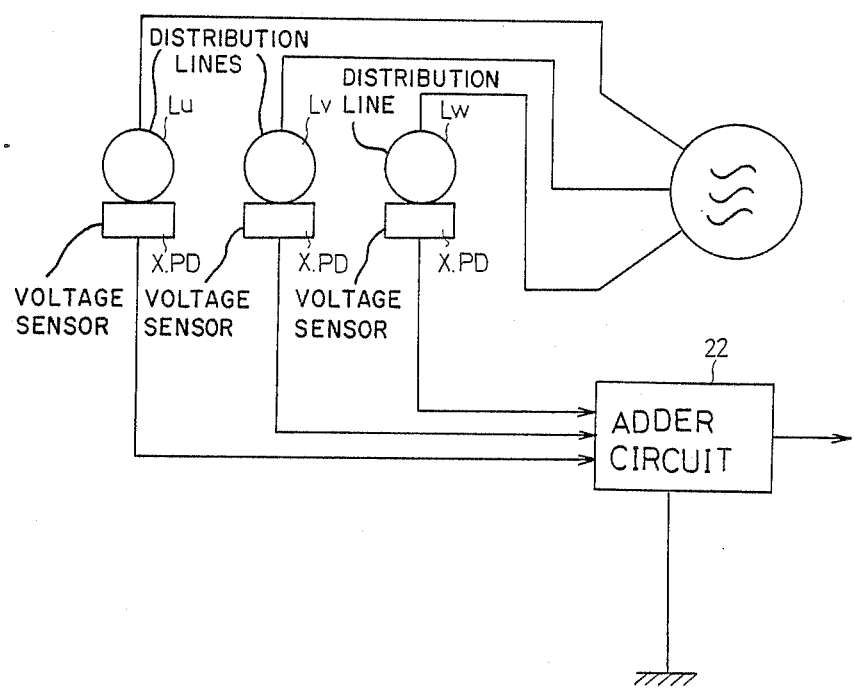
FIG. 8 is a schematic view of an experiment and measurement device which compares the voltage sensor according to this invention and a conventional voltage sensor.

As shown in FIG. 8, the voltage sensors X were directly connected to the corresponding distribution lines Lu, Lv and Lw and the PDs were assembled on the corresponding outer insulation jackets of the lines. The voltage sensors according to this invention were each disposed at a distance l of 100 mm under the corresponding distribution line, as in FIG. 1. One of the distribution lines was put under a condition similar to grounding. The signals output from the voltage sensors X and PDs disposed for the corresponding distribution lines were synthesized by the adder circuit 22 and measured.

When the line voltages were each set to 6.9 kV, the residual voltage was 65 mV in the use of the conventional voltage sensors X and 4.38 mV in the use of the PDs while the residual voltage was 13.5 mV in the use of the voltage sensors according to the present invention.

Figure 9:
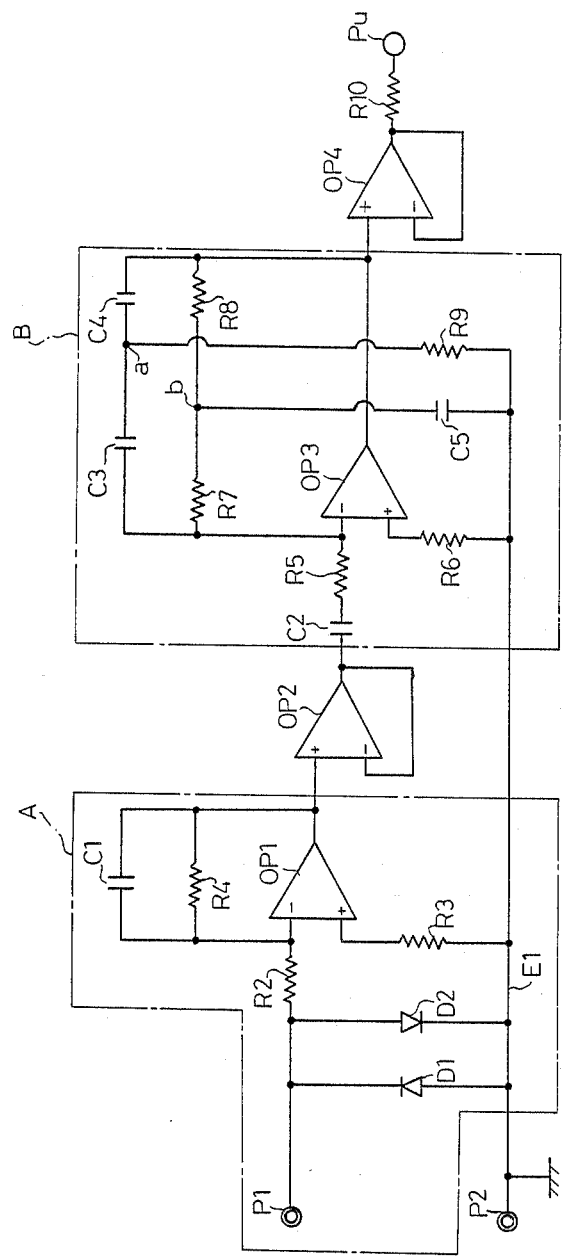
FIG. 9 is a diagram showing the electric circuit of a voltage sensor indicative of a modification of the electric circuit of FIG. 5.

FIG. 9 shows a modification of the signal processing circuit 8, shown in FIG. 5, according to this invention. The amplifier circuit A includes no resistor such as the variable resistor R1 shown in FIG. 5 while the output terminal P1 of the detection electrode 10 is connected via a resistor R2 to an inverting input terminal of the operational amplifier OP1. This circuit arrangement also operates in a way similar to that of the above embodiment.

Figure 10:
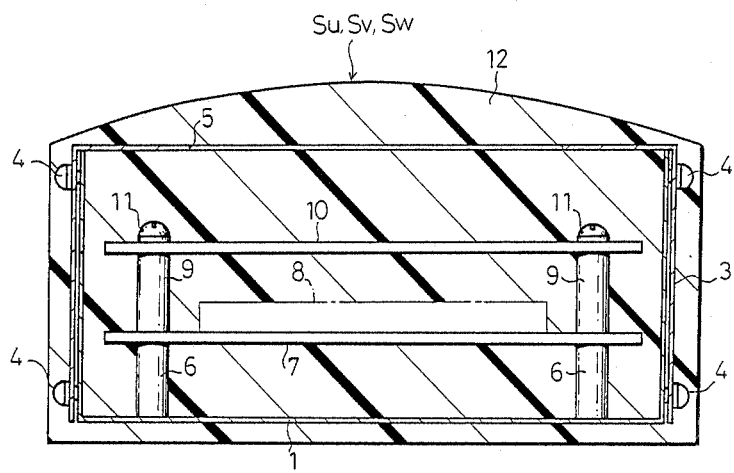
FIG. 10 is a cross-sectional view of a modification of the voltage sensor with a curved upper surface.

FIG. 10 shows an alternative to the voltage sensor shown in FIG. 2.

In the embodiment of FIG. 2 a filler 12 is filled into the case 1 alone while in the voltage sensor of the embodiment of FIG. 10 a filler 12 having the same high permittivity is not only filled into the case 1 and cover 3 but also molded so as to surround the case 1 and cover 3 with the top of the molding being formed into a curved surface circular arc-like in cross section. Thus when this sensor is installed outdoors, high-permittivity rainwater is prevented from collecting on the upper surface of the sensor, so that the sensing sensitivity of the sensor is maintained constant.

It should be noted that while in this modification the top of the molding is formed curved, it is not limited to this shape. The top of the molding is only required to have a shape to remove rainwater therefrom. For example, the molding top may be of a ridge roof type or the entire top may be of a slanted plane type.

This invention should not be limited to the above respective embodiments and may be constituted as follows:

(a) A high-permittivity material is disposed at the displacement current inflow section above the detection electrode 10.

(b) While in each of the respective embodiments mentioned above the entire case 1 is filled up with high-permittivity filler 12, a molding is instead formed around the detection electrode 10 alone using a high-permittivity molding material.

In the embodiments (a) and (b), the presence of a high-permittivity material between a distribution line, the voltage on which is to be measured, and the corresponding detection electrode 10 serves to improve the sensing sensitivity of the detection electrode 10.

(c) The cover 3 is removed from the housing so that a bottomed box with an upper end alone being open is formed in which the open end is used as the displacement current inflow section. The detection electrode 10 is disposed within the case 1 so as to be situated under the inflow section.

As many apparently widely different embodiments of this invention may be made without departing from the spirit and scope thereof, it is to be understood that the invention is not limited to the specific embodiments thereof except as defined in the appended claims.

We claim:

1. A voltage sensor for sensing an alternating voltage of predetermined frequency, with reference to ground, on an electrically charged object, said sensor being disposed with an insulation space toward the electrically charged object, comprising:
- a collection electrode for receiving a displacement current from said object,
- an amplifier circuit for receiving said displacement current referenced to ground from said collection electrode via said insulation space and outputting a signal referenced to ground having a waveform similar to that of said displacement current; and
- a band pass filter circuit for extracting a signal having said predetermined frequency from the output of said amplifier circuit and outputting a signal having an alternating current waveform similar to the potential of said electrically charged object;
- said amplifier circuit comprising an amplifier input circuit with a resistor electrically connected in parallel with said input circuit to receive said displacement current from said collection electrode.

2. A voltage sensor of claim 1, further including:
- an inflow section through which the displacement current from said electrically charged object flows into said sensor;
- said collection electrode being positioned to collect the displacement current from said inflow section, and
- a shield electrode having a shape to cover said collection electrode except for that portion of said collection electrode opposite to said inflow section, said shield electrode being made of an electrically conductive material and maintained at all times at a reference potential, said amplifier and filter being between said shield electrode and collection electrode and being referenced to said shield electrode.

3. A voltage sensor of claim 2, wherein said shield electrode includes a housing for accommodating said collection electrode and wherein said inflow section includes an open window formed in said housing.

4. A voltage sensor of claim 3, wherein said housing includes a base plate for mounting thereon said amplifier circuit and said filter circuit on the opposite side of said collection electrode from said open window, and means for fixing said base plate and said collection electrode to said housing at predetermined intervals.

5. A voltage sensor of claim 4, wherein said housing includes a filler of high permittivity for enveloping at least said collection electrode.

6. The voltage sensor of claim 1, further comprising a conductive case having an aperature in one side thereof, said collection electrode being mounted in and surrounded by said case, and being parallel to and spaced from said one side of said case, said amplifier circuit and filter circuit being mounted in said case between said collection electrode and the side of said case opposite said one side thereof, said amplifier comprising an operational amplifier having an inverting input coupled to said collection electrode and a non-inverting input coupled to said case.

7. The voltage sensor of claim 6, further comprising a potentiometer for coupling said collection electrode to said inverting input of said amplifier.

8. The voltage sensor of claim 6, wherein said case is filled with an insulation material of high permittivity.

9. The voltage sensor of claim 8, wherein said insulation material extends outwardly of said case through said aperture and forms a water shedding surface over said case.

10. The voltage sensor of claim 1 wherein said amplifier has a ground shield, and wherein said resistor is connected between said collection electrode and said ground shield.

11. A voltage sensor for sensing an alternating voltage of predetermined frequency, with reference to ground, on an electrically charged object, said sensor being disposed with an insulation space toward the electrically charged object, comprising:
- a collection electrode for receiving a displacement current from said object;
- an amplifier circuit for receiving said displacement current referenced to ground from said collection electrode via said insulation space and outputting a signal referenced to ground having a waveform similar to that of said displacement current;
- a band pass filter circuit for extracting a signal having said predetermined frequency from the output of said amplifier circuit and outputting a signal having an alternating current waveform similar to the potential of said electrically charged object; and
- an electrical shield surrounding said amplifier and the peripheral region of said collection electrode, whereby the shield separates the peripheral portion of said collection electrode from said object and only the central portion of the side of said collection electrode shield toward said object is exposed to said object.

* * * * *